(12) United States Patent
Hong et al.

(10) Patent No.: US 12,522,749 B2
(45) Date of Patent: Jan. 13, 2026

(54) COMPOSITION FOR SEMICONDUCTOR PROCESSING AND MANUFACTURING METHOD OF SEMICONDUCTOR DEVICE USING THE SAME

(71) Applicant: SK enpulse Co., Ltd., Pyeongtaek-si (KR)

(72) Inventors: Seung Chul Hong, Seoul (KR); Kangsik Myung, Seoul (KR); Han Teo Park, Seoul (KR); Deok Su Han, Seoul (KR); Yongsoo Choi, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 509 days.

(21) Appl. No.: 18/297,260

(22) Filed: Apr. 7, 2023

(65) Prior Publication Data

US 2023/0332017 A1    Oct. 19, 2023

(30) Foreign Application Priority Data

Apr. 13, 2022    (KR) .......... 10-2022-0045761

(51) Int. Cl.
  *C09G 1/02*      (2006.01)
  *H01L 21/3105*   (2006.01)
  *H01L 21/321*    (2006.01)
  *H01L 21/768*    (2006.01)

(52) U.S. Cl.
  CPC ............ *C09G 1/02* (2013.01); *H01L 21/3212* (2013.01); *H01L 21/76819* (2013.01); *H01L 21/7684* (2013.01); *H01L 21/76898* (2013.01); *H01L 21/31053* (2013.01)

(58) Field of Classification Search
  CPC ... C09G 1/00; C09G 1/02; C09G 1/04; C09G 1/06; H01L 21/3212
  See application file for complete search history.

(56) References Cited

U.S. PATENT DOCUMENTS

| | | | |
|---|---|---|---|
| 2004/0229461 A1 | 11/2004 | Darsillo et al. | |
| 2005/0090104 A1* | 4/2005 | Yang | C09G 1/02 438/689 |
| 2020/0024515 A1 | 1/2020 | Lu et al. | |
| 2023/0332016 A1* | 10/2023 | Han | C09G 1/02 |

FOREIGN PATENT DOCUMENTS

| | | |
|---|---|---|
| CN | 102585704 A | 7/2012 |
| CN | 103484025 A | 1/2014 |
| CN | 110114856 A | 8/2019 |
| CN | 113861848 A | 12/2021 |

(Continued)

*Primary Examiner* — Jose R Diaz
(74) *Attorney, Agent, or Firm* — NSIP Law

(57) ABSTRACT

A composition for semiconductor processing includes abrasive particles, and a dishing control additive, comprising a first dishing control additive and a second dishing control additive. The first dishing control additive includes a compound having a betaine group and a salicylic group or a derivative thereof, and the second dishing control additive includes an azole-based compound. The first dishing control additive includes 0.07 parts by weight or more based on 100 parts by weight of the abrasive particles, and the second dishing control additive includes 0.13 parts by weight or less based on 100 parts by weight of the abrasive particles.

15 Claims, 2 Drawing Sheets

(56) References Cited

FOREIGN PATENT DOCUMENTS

| | | |
|---|---:|---:|
| EP | 3 597 711 A1 | 1/2020 |
| JP | 2006-179845 A | 7/2006 |
| JP | 2008-182179 A | 8/2008 |
| JP | 2020-186367 A | 11/2020 |
| KR | 10-2006-0059216 A | 6/2006 |
| KR | 10-2007-0080826 A | 8/2007 |
| KR | 10-2008-0058274 A | 6/2008 |
| KR | 10-2008-0069537 A | 7/2008 |
| KR | 10-2010-0065386 A | 6/2010 |
| KR | 10-2010-0080329 A | 7/2010 |
| KR | 10-1104369 B1 | 1/2012 |
| KR | 10-2018-0073131 A | 7/2018 |
| KR | 10-2018-0132893 A | 12/2018 |
| KR | 10-2020-0010135 A | 1/2020 |
| KR | 10-2164777 B1 | 10/2020 |
| KR | 10-2261822 B1 | 6/2021 |
| TW | 200634119 A | 10/2006 |
| TW | 201708188 A | 3/2017 |

\* cited by examiner

COMPOSITION FOR SEMICONDUCTOR PROCESSING AND MANUFACTURING METHOD OF SEMICONDUCTOR DEVICE USING THE SAME

CROSS-REFERENCE TO RELATED APPLICATION

This application claims the benefit under 35 USC 119(a) of Korean Patent Application No. 10-2022-0045761, filed on Apr. 13, 2022, the entire disclosure of which is incorporated herein by reference for all purposes.

BACKGROUND

1. Field

The following description relates to a composition for semiconductor processing and manufacturing method of semiconductor device using the same.

2. Discussion of Related Art

During semiconductor manufacturing, a CMP process is used to flatten a wafer surface using a polishing pad and a slurry composition. The CMP process polishes the wafer surface using a slurry composition, including an abrasive, while performing an orbital motion in which rotational and linear motions are combined after the polishing pad is in contact with the wafer.

The slurry composition used in the CMP process mainly comprises abrasive particles with a physical action and a compound such as an etchant with a chemical action. Therefore, the slurry composition performs a more optimized and extensive planarization process by selectively etching an exposed portion of the wafer surface through physical and chemical actions.

Controlling the polishing rate for different types of films is desirable when polishing copper wiring.

In polishing the copper wiring, a polishing target includes the copper wiring, a barrier film, and an insulating film (a passivation layer). Currently, the polishing performance also varies depending on the difference between the polishing rate for copper and the polishing rate for the other two films.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a composition for semiconductor processing includes abrasive particles, and a dishing control additive, including a first dishing control additive and a second dishing control additive. The first dishing control additive includes a compound having a betaine group and a salicylic group or a derivative thereof, and the second dishing control additive includes an azole-based compound. The first dishing control additive includes 0.07 parts by weight or more based on 100 parts by weight of the abrasive particles, and the second dishing control additive includes 0.13 parts by weight or less based on 100 parts by weight of the abrasive particles.

The composition may have a value according to Expression 1 below from 0.4 to 0.7, $$(C_{BS}-0.05)+C_{AZ}\times 5,\quad \text{[Expression 1]}$$

where $C_{BS}$ is parts by weight of the first dishing control additive based on 100 parts by weight of the abrasive particles, and $C_{AZ}$ is parts by weight of the second dishing control additive based on 100 parts by weight of the abrasive particles.

The first dishing control additive and the second dishing control additive may be included in a weight ratio of 1:0 to 0.95.

The composition may include 3% by weight or more of the abrasive particles based on a total weight of the composition for semiconductor processing.

The composition may further include an organic acid, wherein the organic acid includes a citric acid.

In another general aspect, a composition for semiconductor processing includes abrasive particles, and a dishing control additive, including a first dishing control additive including a compound from a betaine group and a salicylic group or a derivative thereof, and a second dishing control additive of an azole-based compound. The composition has a value according to Expression 2 from 4 to 7, $$(C_{P}-5)\times\{(C_{BS}-0.05)+C_{AZ}\times 5\},\quad \text{[Expression 2]}$$

where $C_P$ is parts by weight of the abrasive particles based on 100 parts by weight of the composition for semiconductor processing, $C_{BS}$ is parts by weight of the first dishing control additive based on 100 parts by weight of the abrasive particles, and $C_{AZ}$ is parts by weight of the second dishing control additive based on 100 parts by weight of the abrasive particles.

The composition may further include an organic acid and a polymer compound including a halogen group. The polymer compound may include 0.5 parts by weight or less based on 1 part by weight of the organic acid.

A ratio between a polishing rate for an insulating film and a polishing rate for a barrier film may be 1:0.45 to 0.7.

A ratio between a polishing rate for an insulating film and a polishing rate for a conductive film may be 1:0.85 to 1.2.

The composition may polish a substrate having a through via. The substrate may include an insulating film, a conductive film, and a barrier film on a surface thereof. The conductive film may have a polishing rate of 3,800 angstroms/min or more.

In another general aspect, A method of manufacturing a semiconductor device, includes preparing a platen on which a polishing pad is mounted and a carrier accommodating a substrate having a through via, and polishing a surface of the substrate with a composition, using a polishing surface of the polishing pad, by rotating either one or both of the platen and the carrier. The substrate includes an insulating film, a conductive film, and a barrier film. The composition includes abrasive particles and a dishing control additive, including a first dishing control additive and a second dishing control additive. The first dishing control additive includes a compound having a betaine group and a salicylic group or a derivative thereof, and the second dishing control additive includes an azole-based compound. The first dishing control additive includes 0.07 parts by weight or more based on 100 parts by weight of the abrasive particles, and the second dishing control additive includes 0.13 parts by weight or less based on 100 parts by weight of the abrasive particles.

The composition may have a value according to Expression 1 below from 0.4 to 0.7, $$(C_{BS}-0.05)+C_{AZ}\times 5,\quad \text{[Expression 1]}$$

where $C_{BS}$ is parts by weight of the first dishing control additive based on 100 parts by weight of the abrasive particles, and $C_{AZ}$ is parts by weight of the second dishing control additive based on 100 parts by weight of the abrasive particles.

The first dishing control additive and the second dishing control additive may include a weight ratio of 1:0 to 0.95.

The composition may include 3% by weight or more of the abrasive particles based on a total weight of the composition for semiconductor processing.

The composition may include an organic acid, and the organic acid includes a citric acid.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
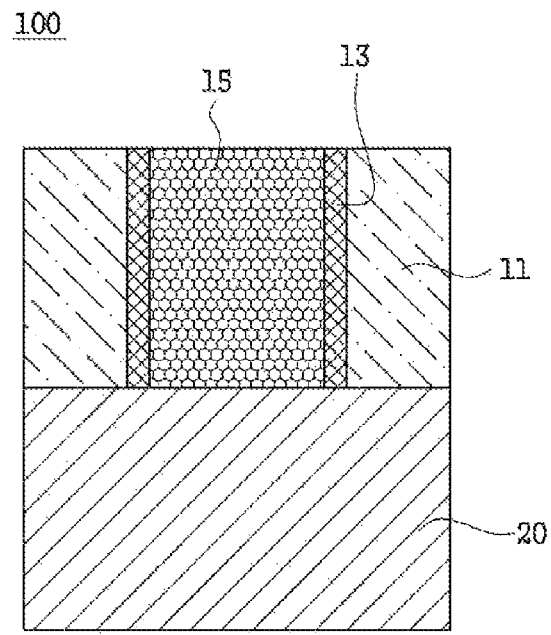
FIG. 1 is a conceptual diagram illustrating an example of a cross-section of a substrate, including a through via planarized by a composition for semiconductor processing.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A composition for semiconductor processing, according to an embodiment, includes abrasive particles and a dishing control additive.

Abrasive Particles

Abrasive particles mainly perform a physical etching action and may perform a planarization action through mechanical friction with a surface of an object to be polished.

The abrasive particles may include inorganic particles, organic particles, or organic and inorganic composite particles.

The inorganic particles may include inorganic particles surface-modified with organic material. The inorganic particles should be understood as a concept encompassing a trace amount of organic components. At this time, the trace amount means a content of about 0.03 parts by weight or less based on a total of 100 parts by weight of the abrasive particles. The organic and inorganic composite particles include those including 50 to 200 parts by weight of organic components based on 100 parts by weight of the inorganic components.

The inorganic particle may include, for example, one metal oxide particle selected from the group consisting of silica ($SiO_2$), ceria ($CeO_2$), alumina ($Al_2O_3$), zirconia ($ZrO_2$), and combinations thereof.

The abrasive particles may be in a colloidal state. For example, the abrasive particles may include colloidal inorganic particles.

The abrasive particles may be metal oxide particles having a functional group-exposed surface. The surface may include a first functional group, including an epoxy group at a terminal and/or a second functional group, including an amine group at a terminal. The first functional group and the second functional group may have a molar ratio of 1:1 to 15. The first functional group and the second functional group may have a molar ratio of 1:1 to 8. When the first functional group and the second functional group are applied in such a ratio, it is possible to improve the polishing composition's storage stability further while reducing the possibility of defects during polishing.

A silane compound having the first functional group may be, for example, amino silane, ureido silane, and combinations thereof, and may be amino silane. The amino silane may be any one selected from the group consisting of, for example, 3-aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine, N-bis[3-(trimethoxysilyl)propyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethylaminopropyltriethoxysilane, dimethylaminopropyltrimethoxysilane, N-[3-(trimethoxysilyl)propyl]butylamine, and combinations thereof. The ureido silane may be any one selected from the group consisting of 3-ureidotrimethoxysilane, 3-ureidotriethoxysilane, and combinations thereof.

A silane compound having the second functional group may be epoxy silane.

The epoxy silane may be any one selected from the group consisting of, for example, 3-glycidoxypropyltrimethoxysilane, 3-glycidoxypropyltriethoxysilane, 3-(2,3-epoxypropoxypropyl)methyldimethoxysilane, 3-(2,3-epoxypropoxypropyl)methyldimethoxysilane, 3-(2,3-epoxypropoxypropyl)methyldiethoxysilane, 2-(3,4-epoxycyclohexyl)ethyltrimethoxysilane, and combinations thereof.

The silane compound may be applied in an amount of 1 to 10 parts by weight based on 100 parts by weight of the metal oxide particles. The silane compound may be applied in an amount of 3 to 8 parts by weight based on 100 parts by weight of the metal oxide particles. In this case, the surface modification of the metal oxide particle can sufficiently proceed, and a film layer is not formed on the metal oxide particle, so that the polishing rate of the abrasive particle can be maintained at a desired level.

The content of the silane compound is a sum of the content of the silane compound having the first functional group and the content of the silane compound having the second functional group.

The abrasive particle may have a diameter ($D_{50}$) of 10 nm to 120 nm. The abrasive particle may have a diameter ($D_{50}$) of 15 nm to 90 nm. The abrasive particle may have a diameter ($D_{50}$) of 20 nm to 60 nm. When the diameter ($D_{50}$) of the abrasive particle exceeds 120 nm, the possibility of generating defects such as scratches on a substrate to be polished may increase. When the diameter is less than 10 nm, the dispersibility of the particles may deteriorate, or the occurrence of defects may rather increase. When the diameter is 20 nm to 60 nm, excellent physical properties can be obtained when applied as the composition for semiconductor processing of a substrate having a fine wiring width.

The diameter mentioned above is based on Malvern's Nano-ZS equipment, which measures the size of the particle by dynamic light scattering (DLS).

The abrasive particle may have a zeta potential of +1 mV to +80 mV, +15 mV to +60 mV, or +20 mV to +45 mV. When inorganic or organic particles do not have a zeta potential within the above range, those treated to have the above zeta potential through surface modification may be applied.

The method of measuring the zeta potential of the abrasive particle is not particularly limited, but, for example, the potential can be measured after about 1 mL of the abrasive particles are injected into a cell for measurement using zeta potential measuring equipment (Malvern Co., Zeta-sizer Nano ZS). A measurement value of the zeta potential is based on a value measured in a state in which the abrasive particles are dispersed in pure water.

The abrasive particle may have a zeta potential within the above range by modifying the surface of a colloidal silica particle with amino silane and/or epoxy silane.

The abrasive particle may be included in an amount of more than 3% by weight or 5% by weight or more based on the total weight of the composition for semiconductor processing. The abrasive particle may be included at more than 12% by weight based on the total weight of the composition for semiconductor processing. The abrasive particle may be included at 13% by weight or more based on the total weight of the composition for semiconductor processing. The abrasive particle may be included at 14% by weight or more based on the total weight of the composition for semiconductor processing. The abrasive particle may be included in an amount of 30% by weight or less or 22% by weight or less based on the total weight of the composition for semiconductor processing.

When the composition for semiconductor processing includes abrasive particles within the range described above, a more efficient polishing process can be operated.

Dishing Control Additive

The dishing control additive may be a compound with a betaine group and a salicylic group or a derivative. To distinguish the dishing control additive with a betaine group and a salicylic group from an azole-based dishing control additive described below, the compound with a betaine group and a salicyl group or the derivative thereof is referred to as a first dishing control additive.

The first dishing control additive may include betaine salicylate. In addition, the first dishing control additive may include any one selected from the group consisting of betaine hydrochloride, betaine perchloric acid, betaine aldehyde chloride, and combinations thereof, and/or salicylic acid.

When the first dishing control additive is applied to the composition for semiconductor processing, the occurrence of dishing can be substantially suppressed even when a relatively high polishing rate is applied.

The composition for semiconductor processing may include 0.07 parts by weight or more of the first dishing control additive based on 100 parts by weight of the abrasive particles. The composition for semiconductor processing may include 0.09 parts by weight or more, 0.11 parts by weight or more, or 0.133 parts by weight or more of the first dishing control additive based on 100 parts by weight of the abrasive particles. The composition for semiconductor processing may include 1.134 parts by weight or less or 0.533 parts by weight or less of the first dishing control additive based on 100 parts by weight of the abrasive particles. When the first dishing control additive is contained within the above range, dishing in a metal material, such as copper, and abrasive particles can be substantially suppressed.

The first dishing control additive may be separated into ions in an aqueous solution. Then, removing pure water as a solvent establishes the content and/or content ratio of the first dishing control additive.

The dishing control additive may include a second dishing control additive, an azole-based compound. The azole-based compound is referred to as the second dishing control additive to distinguish it from the compound having a betaine group and a salicylic group.

Examples of the second dishing control additive may include one selected from the group consisting of benzotriazole (BTA), 5-methyl-1H-benzotriazole (5-MBTA), 3-amino-1,2,4-triazole, 5-phenyl-1H-tetrazole, 3-amino-5-methyl-4H-1,2,4-triazole, 5-aminotetrazole (ATZ), 1,2,4-triazole, tolyltriazole and combinations thereof.

Examples of the second dishing control additive may include one selected from the group consisting of 5-aminotetrazole (ATZ), 5-methyl-1H-benzotriazole (5-MBTA), and combinations thereof.

When the second dishing control additive is applied together with the first dishing control additive, the occurrence of dishing of copper or the like can be suppressed even when a relatively high polishing rate is applied.

The second dishing control additive may be included in 0 to 0.13 parts by weight, 0.03 to 0.13 parts by weight, or 0.0667 to 0.1000 parts by weight based on 100 parts by weight of the abrasive particles. When the second dishing control additive is included within the above range, the dishing suppression function of the composition for semiconductor processing can be further enhanced.

The composition for semiconductor processing of an embodiment may include the first dishing control additive and the second dishing control additive in a weight ratio of 1:0 to 0.95, 1:0.1 to 0.85, 1:0.2 to 0.7, or 1:0.5 to 0.75.

As the dishing control additive, only the first dishing control additive may be applied, or the first and second dishing control additives may be applied together. In the former case (one additive applied), the first dishing control additive binds to the metal surface during a polishing process and can act as a relatively strong erosion inhibitor, which helps to maintain a polishing rate and a dishing control level within the appropriate intended ranges. In the case of the latter (two additives applied), by applying both the first dishing control additive, which acts as a strong erosion inhibitor, and the second dishing control additive, which acts as a weak erosion inhibitor, a more efficient dishing control effect can be obtained, and better process efficiency and economic feasibility can be obtained.

Other Additives

The composition for semiconductor processing of an embodiment may include an organic acid as an additive.

The organic acid may function as a chelator that mainly controls polishing properties for metals such as copper or traps metal ions such as copper ions.

The organic acid may include a carboxyl group or an alcohol group. Illustratively, the organic acid may be carboxylic acid.

The organic acid may include one selected from the group consisting of acetic acid, formic acid, benzoic acid, nicotinic acid, picolinic acid, alanine, phenylalanine, valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylene-diamine-tetraacetic acid, nitrilotriacetic acid, iminodiacetic acid, and combinations thereof.

The composition for semiconductor processing of an embodiment may include citric acid as the organic acid. In the case of citric acid, it can also play a role in adjusting a polishing rate of a conductive film containing a metal such as copper.

The composition for semiconductor processing of an embodiment may include 0.01 parts by weight to 3 parts by weight of the organic acid based on 100 parts by weight of the abrasive particles. The composition for semiconductor processing may include 0.05 parts by weight to 2 parts by weight, 0.1 parts by weight to 1 part by weight, or 0.12 parts by weight to 0.8 parts by weight of the organic acid based on 100 parts by weight of the abrasive particles. When the organic acid is included in the above content range, the planarization effect may be more excellent on a surface where a conductive film containing a metal such as copper and a film of another material arranged side by side with the conductive film are simultaneously present.

The composition for semiconductor processing of an embodiment may further include a polymer compound having a halogen group as an additive. The polymer compound having a halogen group may serve as a surfactant in the composition for semiconductor processing.

The polymer compound having a halogen group may include a surfactant having a fluorine-based functional group.

The surfactant having a fluorine-based functional group may be a non-ionic polymer.

The surfactant with a fluorine-based functional group may be a non-ionic polymer with an ethoxy group.

The polymer compound with a halogen group may have an average molecular weight of less than 3,000 g/mol. The polymer compound with a halogen group may have an average molecular weight of less than 2,000 g/mol. The polymer compound with a halogen group may have an average molecular weight of less than 1,000 g/mol.

Examples of the polymer compound having a halogen group are BNO—BS—BOH from BNO Chem., FS-30, FS-31, FS-34, ET-3015, ET-3150, ET-3050, and Capstone FS-3100 from the Chemours Company, and the like may be applied alone or in combination.

When the composition for semiconductor processing includes the polymer compound having a halogen group, excessive adsorption of the abrasive particle to the surface to be polished may be effectively prevented. In addition, in this case, it is possible to change or maintain a surface to be planarized, such as a silicon oxide film, in a state favorable for polishing. In addition, it is possible to prevent the growth of bacteria and fungi in the composition for semiconductor processing and improve long-term storage stability.

In the composition for semiconductor processing of an embodiment, the polymer compound having a halogen group may be included in 0.0001 to 1 part by weight or 0.0003 to 0.8 parts by weight based on 100 parts by weight of the abrasive particles. When the polymer compound having a halogen group is included within the above range, it is possible to obtain an effect of reducing defects on the polished surface while maintaining other functions at an appropriate level or higher.

The composition for semiconductor processing of an embodiment may include a phosphoric acid-based compound. The phosphoric acid-based compound may control the polishing properties of a barrier film, such as a silicon nitride film.

The phosphoric acid-based compound may be one selected from the group consisting of, for example, phosphomolybdic acid or a salt thereof, nitrilotris (methylenephosphonic acid) or a salt thereof, phosphorus trichloride or a salt thereof, pyrophosphate or a salt thereof, and combinations thereof. The salt may include a sodium salt, a potassium salt, and the like.

The phosphoric acid-based compound may include nitrilotris (methylenephosphonic acid) and/or potassium pyrophosphate.

The composition for semiconductor processing may include 0.01 parts by weight to 1.0 part by weight, 0.02 parts by weight to 0.7 parts by weight, 0.05 parts by weight to 0.5 parts by weight, 0.07 parts by weight to 0.3 parts by weight, or 0.100 parts by weight to 0.133 parts by weight of the phosphoric acid compound based on 100 parts by weight of the abrasive particles. Therefore, when the phosphoric acid-based compound is applied to the composition for semiconductor processing in the above amount, it is possible to properly secure the polishing properties for the barrier film. In addition, the planarization process can be performed more excellently by achieving an appropriate polishing balance between the barrier film and another film. Specifically, a phosphoric acid-based compound and a nitride included in a barrier film, such as a silicon nitride film, combine to weaken the barrier film, thereby improving the polishing rate of the barrier film.

In the composition for semiconductor processing of an embodiment, an acid component may be added in addition to the above components to prepare and maintain a solution in an appropriate pH range. The acid component may be applied to the polishing composition for semiconductor processing together with a pH adjusting agent.

As the acid component, one or more of hydrochloric acid (HCl), phosphoric acid ($H_3PO_4$), sulfuric acid ($H_2SO_4$), nitric acid ($HNO_3$), and the like may be used. As the pH adjusting agent, one or more of ammonium hydroxide ($NH_4OH$), potassium hydroxide (KOH), sodium hydroxide (NaOH), and the like may be used.

The acid component and the pH adjusting agent may be applied appropriately according to the intended pH.

The composition for semiconductor processing of an embodiment may further include a non-ionic polymer.

The non-ionic polymers may be at least one selected from the group consisting of polyethylene glycol, polypropylene glycol, polyvinylpyrrolidone, polyethylene oxide, polypropylene oxide, polyalkyl oxide, polyoxyethylene oxide, a polyethylene oxide-propylene oxide copolymer, cellulose, methyl cellulose, methyl hydroxylethyl cellulose, methyl hydroxypropyl cellulose, hydroxyethyl cellulose, carboxymethyl cellulose, carboxymethyl hydroxyethyl cellulose, sulfoethyl cellulose, and carboxymethyl sulfoethyl cellulose.

Non-ionic polymers with an average molecular weight of less than 25,000 g/mol may be applied. When the weight average molecular weight of the non-ionic polymer is less than 25,000 g/mol, the non-ionic polymer may have excellent solubility and dispersibility. A non-ionic polymer with an average molecular weight of 1,000 g/mol or more and less than 25,000 g/mol may be applied. When a non-ionic polymer in the above range is applied, the composition for semiconductor processing may have better solubility and dispersion stability and be advantageous in polishing properties.

The composition for semiconductor processing of an embodiment may be an aqueous dispersion solution. The aqueous dispersion solution means that pure water is applied as a main solvent, and includes a case in which some liquid organic materials or some organic solvents are included.

Composition for Semiconductor Processing

According to an embodiment, the polishing composition for semiconductor processing may be an acidic solution. Specifically, the pH of the polishing composition for semiconductor processing may be 2 to 5. The pH of the polishing composition for semiconductor processing may be 2 to 4.5. When an acidic environment is maintained within the above range, it is possible to maintain the polishing rate and quality at a certain level or higher while preventing excessive erosion of metal components or polishing devices.

According to an embodiment, the composition for semiconductor processing may have a value according to Expression 1 below.

$$(C_{BS}-0.05)+C_{AZ}\times 5 \qquad [\text{Expression 1}]$$

In Expression 1, $C_{BS}$ is the content (parts by weight) of the first dishing control additive based on 100 parts by weight of the abrasive particles, and $C_{AZ}$ is the content (parts by weight) of the second dishing control additive based on 100 parts by weight of the abrasive particles.

The value, according to Expression 1, of the composition for semiconductor processing may be 0.4 to 0.7. The value, according to Expression 1, of the composition for semiconductor processing may be 0.4 to 0.6 or 0.4167 to 0.5833. When the value according to Expression 1 satisfies the above range, the occurrence of dishing of the conductive film may be substantially suppressed while the composition for semiconductor processing maintains a polishing rate of a conductive film, such as copper, at an appropriate level or higher.

The composition for semiconductor processing, according to an embodiment, includes abrasive particles and a dishing control additive, wherein the dishing control additive includes: a first dishing control additive that is a compound having a betaine group and a salicylic group or a derivative thereof; and a second dishing control additive that is an azole-based compound, and the composition for semiconductor processing may have a value of 4 to 7 according to Expression 2 below.

$$(C_P-5)\times\{(C_{BS}-0.05)+C_{AZ}\times 5\} \qquad [\text{Expression 2}]$$

In Expression 2, $C_P$ is the content (parts by weight) of the abrasive particles based on 100 parts by weight of the composition for semiconductor processing, $C_{BS}$ is the content (parts by weight) of the first dishing control additive based on 100 parts by weight of the abrasive particles, and $C_{AZ}$ is a content (parts by weight) of the second dishing control additive based on 100 parts by weight of the abrasive particles.

The composition for semiconductor processing may have a value of 4 or more, 4.167 or more, or 4.5 or more, according to Expression 2. The value, according to Expression 2 may be 7 or less, 6.5 or less, 6 or less, or 5.833 or less.

When the value of Expression 2 satisfies the above range, a dishing control effect of the composition for semiconductor processing is more excellent.

The composition for semiconductor processing may include the polymer compound having a halogen group at 0.5 parts by weight or less, 0.3 parts by weight or less, or 0.2 parts by weight or less based on 1 part by weight of the organic acid. In this case, it is possible to reduce the occurrence of organic particulate defects. The composition for semiconductor processing may include the polymer compound having a halogen group at more than 0 parts by weight or 0.01 parts by weight or more based on 1 part by weight of the organic acid.

When applied at such a content ratio, it is possible to substantially suppress the generation of adhesive foreign matter by interactions of the polymer compound with other components while suppressing the generation of defects due to the surface adsorption of particles generated during the polishing process.

The composition for semiconductor processing of an embodiment has excellent storage stability.

In the composition for semiconductor processing of an embodiment, the time point at which the particle size increases by 10% or more based on the $D_{50}$ of the abrasive particle may be 12 months or more. This effect means that the particles can be stably well dispersed even after the composition for semiconductor processing is stored for a substantially long period of time, and the composition can be stored for a longer period of time.

Some polishing compositions for semiconductor processing lack particle dispersion stability, so that it may be necessary to mix and apply the acid component immediately before use. According to an embodiment, the composition for semiconductor processing has excellent particle dispersion stability in a state in which all acid components are included, which shows that the convenience of use is further improved.

The composition for semiconductor processing of an embodiment is advantageous for application to a polishing process of a substrate such as a semiconductor wafer, including a through via. The through via may be a through silicon via (TSV), but is not limited thereto.

Figure 2:
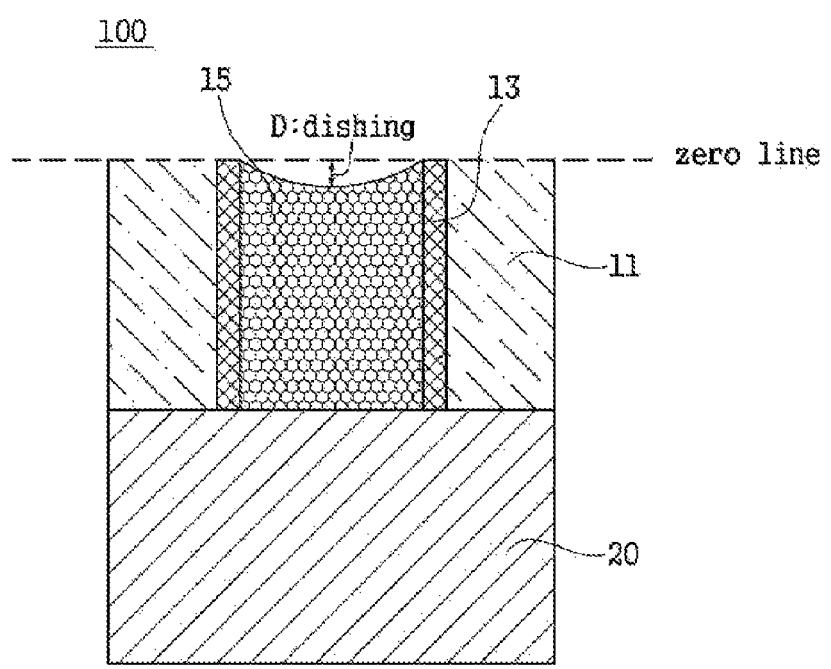
FIG. 2 is a conceptual diagram illustrating an example of dishing using a cross-section of the substrate.
Figure 3:
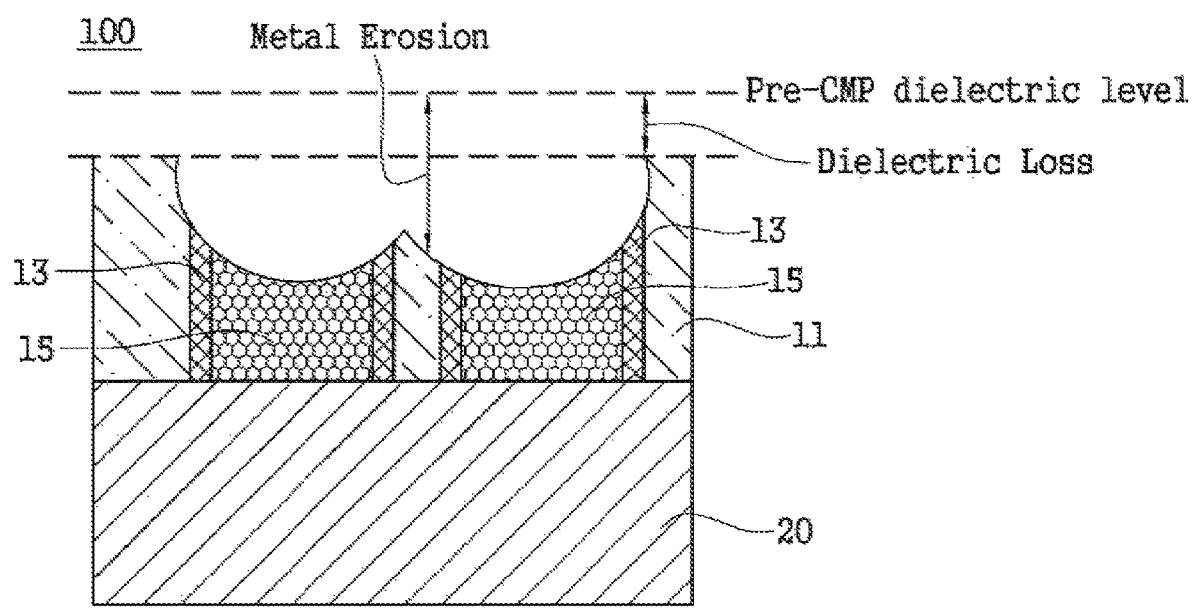
FIG. 3 is a conceptual diagram illustrating an example of metal erosion using a cross-section of the substrate.

FIG. 1 is a conceptual diagram illustrating a cross-section of a substrate (including a through via) planarized by the composition for semiconductor processing, FIG. 2 is a conceptual diagram illustrating dishing using a cross-section of the substrate, and FIG. 3 is a conceptual diagram illustrating metal erosion using a cross-section of the substrate. Referring to FIGS. 1 to 3, the present invention will be described in more detail.

A substrate 100 including a through via includes an insulating film material such as $SiO_2$ that functions as an insulating film 11, a barrier film material such as SiN that functions as a barrier film 13 that prevents the movement of metal ions, and a conductive film material such as copper applied as a conductive film 15 that has electrical conductivity and transmits an electrical signal.

In a planarization process of the substrate, a surface on which two or three types of films having different properties are simultaneously exposed is planarized. Since different films have different properties (strength, degree of oxidation, etc.), it is not easy to planarize the films simultaneously and quickly.

Semiconductor substrates are being miniaturized and becoming complicated, such as the use of fine lines and frequent use of through vias. Because of this, a more rigorous planarization process is required, along with process efficiency. Through vias have a larger exposed area than fine lines and are composed of a metal that is softer than metal oxides or metal nitrides, so defects such as dishing (see FIG. 2) or metal erosion (see FIG. 3) are more likely to occur.

When excessive dishing occurs in a through via portion, since an incomplete electrical connection occurs in a vertical direction, it is difficult to transmit sufficient electrical signals, which can cause fatal defects in semiconductors.

The composition for semiconductor processing of an embodiment substantially suppresses the dishing of a conductive film, such as copper, while applying an efficient polishing process.

The composition for semiconductor processing can control the dishing to −12 nm or more, −10 nm or more, or −8 nm or more based on a through via (filled with electroplated copper) having a circular opening with a diameter of 5 μm. The dishing may be controlled to +5 nm or less, or 0 nm or less. At this time, assuming that an ideal planarized surface is considered a baseline (a zero line), when the surface of the conductive film is present below the baseline, the degree of the dishing is evaluated as "−," and when the surface of the conductive membrane is higher than the baseline, the degree of the dishing is evaluated as "+," and when the degree of the dishing is evaluated as "+," it means that it is actually protruding.

To evaluate the dishing, the substrate (having a through via with a diameter of 5 μm and filled with circular electroplated copper) is polished for 60 seconds under the conditions described below, and then a surface profile of the via opening sampled at three or more places on the substrate is measured using atomic force microscopy (AFM) equipment, and an average value of the measured values is taken as the standard.

For surface profile measurement using the AFM equipment, Park Systems' XE-150 equipment is used to measure the average height from the baseline according to the manufacturer's manual.

Polishing conditions) slurry flow rate: 300 ml/min, carrier speed: 120 rpm, platen speed: 117 rpm, pressurization: 3.0 psi down pressure, polishing equipment: CTS's 300 mm CMP equipment, and polishing pad: SKC Solmics' HD-500 model polishing pad.

The composition for semiconductor processing of an embodiment enables an efficient polishing process while controlling the degree of dishing within an appropriate level.

When using the composition for semiconductor processing to polish a surface of a substrate having different films, a polishing speed ratio of each film may have the following range.

The composition for semiconductor processing may have a ratio between a polishing rate of the insulating film and a polishing rate of the conductive film of 1:0.9 to 1.5, 1:0.95 to 1.2, or 1:0.99 to 1.04. In the case of having such a ratio, it is advantageous for efficiently planarizing the substrate.

The composition for semiconductor processing may have a ratio between a polishing rate of the barrier film and a polishing rate of the conductive film of 1:1.5 to 3.0, 1:1.7 to 2.2, or 1:1.73 to 1.84. In the case of having such a ratio, it is advantageous for efficiently planarizing the substrate.

The conductive film polishing rate of the composition for semiconductor processing may be 3,800 Å/min to 4600 Å/min, 4000 Å/min to about 4500 Å/min, or about 4100 Å/min to about 4400 Å/min.

The barrier film polishing rate of the composition for semiconductor processing may be 2000 Å/min to 2700 Å/min, 2100 Å/min to about 2600 Å/min, or about 2200 Å/min to about 2500 Å/min.

The insulating film polishing rate of the composition for semiconductor processing may be 3600 Å/min to 4400 Å/min, 3700 Å/min to about 4300 Å/min, or about 3,800 Å/min to about 4200 Å/min.

Because this is a fairly high level of polishing rate, when the composition for semiconductor processing according to embodiments is applied, the surface of a substrate having three different films can be efficiently etched while substantially suppressing the occurrence of dishing.

The polishing rate or ratio is based on the measurement under the above-mentioned polishing conditions.

The composition for semiconductor processing of an embodiment may control the number of defects of an insulating film to a certain level or less. For example, the composition for semiconductor processing may have 400 or fewer defects, 300 or fewer defects, 100 or fewer defects, or 64 or fewer defects based on one surface of a silicon oxide film wafer having a diameter of 300 mm. The number of defects may be 30 or more, or 40 or more. The number of defects means the total number of defects measured on the polished wafer surface through AIT-XP+ equipment after applying the above-described polishing conditions and performing a cleaning process described below.

The composition for semiconductor processing having the characteristics described above enables an efficient polishing process and suppresses the dishing of a conductive film, which is advantageous for polishing a substrate having a through via formed therein.

Preparation of the composition for semiconductor processing of an embodiment may be applied by mixing the abrasive particles and each component in a solvent such as pure water, and may include a process of stirring in a conventional manner so that the particles are well dispersed. When applying the surface-modified abrasive particles, it is possible to apply a method of first surface-modifying the abrasive particles and then dispersing the particles.

Application of the composition for semiconductor processing of an embodiment can be carried out while pressurizing an object to be polished down, rotating the object and/or polishing pad, and injecting the composition for semiconductor processing after mounting the object to be polished and the polishing pad in a substrate polishing apparatus. The characteristics described above is described based on measurements under the above polishing conditions. However, utilization of the composition for semiconductor processing is not limited to the polishing conditions.

Manufacturing Method of Semiconductor Device

A method of manufacturing a semiconductor device, according to an embodiment, includes preparing a platen on which a polishing pad is mounted and a carrier accommodating an object to be polished; and polishing a surface of the object to be polished by a polishing surface of the polishing pad by rotating at least one of the platen and the carrier.

The object to be polished may be a substrate having a through via, and the substrate includes an insulating film, a conductive film, and a barrier film on a surface thereof.

The polishing is performed with the composition for semiconductor processing, which is the composition for semiconductor processing according to the above-described embodiment.

Specific descriptions regarding the composition for semiconductor processing and the effect obtained by applying the composition are omitted because they overlap with the above description.

Hereinafter, the present invention will be described in more detail through specific examples. The following examples are merely examples for facilitating the understanding of the present invention, and the scope of the invention is not limited thereto.

1. Preparation of Composition for Semiconductor Processing

A composition for semiconductor processing, including abrasive particles, a dishing control additive, an organic acid, and the like, and having a pH of 2 or more and less than 4.5 was prepared.

Colloidal silica was used as the abrasive particle, and colloidal silica surface-modified with 3-aminopropyltriethoxysilane as an amine-based silane, was applied as an abrasive particle with an average particle size ($D_{50}$) of about 42 nm. About 2 to 5 parts by weight of the amine-based silane was used based on 100 parts by weight of the colloidal silica, and a zeta potential measured in pure water was in the range of +19 to +45 mV. The surface-modified abrasive particle was used in about 15 parts by weight based on 100 parts by weight of the composition for semiconductor processing.

As the dishing control additive, betaine salicylate (first dishing control additive) and 5-aminotetrazole (second dishing control additive) were used in the contents shown in Table 1 below. Citric acid was used as an organic acid serving as a chelator in the amount shown in Table 1 below, Capstone FS-3100 was used as a polymer, including a halogen group, and nitrilotris (methylenephosphonic acid) was used as a phosphoric acid compound. Acetic acid and a KOH solution were used as a pH adjusting agent. Ultrapure water was used as a solvent. The remaining amount of ultrapure water was used so that the entire composition for semiconductor processing was 100 parts by weight. The pH of the composition for semiconductor processing was measured using a hydrogen ion concentration (pH) measuring device (Horiba, Laqua) while stirring at 200 rpm under room temperature conditions of 20° C. to 25° C. to confirm that it was within the above-mentioned range.

TABLE 1

| | Parts by weight# | Modified abrasive particle | First dishing control additive | Second dishing control additive | Organic acid | Ratio* | Value of Expression 1** | Value of Expression 2** | Phosphoric acid-based additive | Polymer including halogen group | pH adjusting agent |
|---|---|---|---|---|---|---|---|---|---|---|---|
| Example 1 | 15 | | 0.02 (0.133) | 0.01 (0.067) | 0.025 (0.167) | 0.50 | 0.4167 | 4.167 | 0.02 (0.133) | 0.001 (0.0067) | 0.075 |
| Example 2 | 15 | | 0.02 (0.133) | 0.015 (0.100) | 0.025 (0.167) | 0.75 | 0.5833 | 5.833 | 0.015 (0.100) | 0.001 (0.0067) | 0.075 |

TABLE 1-continued

| Parts by weight# | Modified abrasive particle | First dishing control additive | Second dishing control additive | Organic acid | Ratio* | Value of Expression 1** | Value of Expression 2** | Phosphoric acid-based additive | Polymer including halogen group | pH adjusting agent |
|---|---|---|---|---|---|---|---|---|---|---|
| Example 3 | 15 | 0.08 (0.533) | 0 (0) | 0.025 (0.167) | 0.00 | 0.4833 | 4.833 | 0.02 (0.133) | 0.001 (0.0067) | 0.075 |
| Comparative Example 1 | 15 | 0.01 (0.067) | 0.01 (0.067) | 0.025 (0.167) | 1.00 | 0.3500 | 3.500 | 0.02 (0.133) | 0.001 (0.0067) | 0.075 |
| Comparative Example 2 | 15 | 0.02 (0.133) | 0.02 (0.133) | 0.025 (0.167) | 1.00 | 0.7500 | 7.500 | 0.02 (0.133) | 0.001 (0.0067) | 0.075 |

Numbers in parentheses indicate respective contents based on 100 parts by weight of the abrasive particles.
*The ratio is a ratio of the content of the second dishing additive based on the content of the first dishing control additive.
**Values of Expression 1 follow Expression 1 below.

$$(C_{BS}-0.05)+C_{AZ}\times 5 \quad \text{[Expression 1]}$$

In Expression 1, $C_{BS}$ is a content (parts by weight) of the first dishing control additive based on 100 parts by weight of the abrasive particles, and $C_{AZ}$ is a content (parts by weight) of the second dishing control additive based on 100 parts by weight of the abrasive particles.

** Values of Expression 2 follow Expression 2 below.

$$(C_P-5)\times\{(C_{BS}-0.05)+C_{AZ}\times 5\} \quad \text{[Expression 2]}$$

In Expression 2, $C_P$ is a content (parts by weight) of the abrasive particles based on 100 parts by weight of the composition for semiconductor processing, $C_{BS}$ is a content (parts by weight) of the first dishing control additive based on 100 parts by weight of the abrasive particles, and $C_{AZ}$ is a content (parts by weight) of the second dishing control additive based on 100 parts by weight of the abrasive particles.

2. Evaluation of Physical Properties of Composition for Semiconductor Processing (1) Polishing Evaluation A copper wafer with a thickness of about 15,000 Å, a silicon oxide film wafer with a thickness of about 20,000 Å, and a silicon nitride film wafer with a thickness of about 15,000 Å were used to perform the polishing evaluation for a polishing rate of a conductive film, a polishing rate of an insulating film, and a polishing rate of a barrier film.

Each wafer was polished in a conventional manner after mounting an HD-500 model polishing pad from SKC Solmics on a CMP device (300 mm CMP equipment from CTS) under conditions of a 3.0 psi down pressure, a carrier speed of 120 rpm, a platen speed of 117 rpm, and a slurry flow rate of 300 ml/min.

After the polishing process, the thickness of each wafer was measured, and a polishing rate (Å/min) for the copper film, silicon oxide film, and silicon nitride film of the corresponding slurry composition was calculated, respectively.

(2) Evaluation of Defects in Insulating Film

After polishing under the same conditions as the polishing evaluation, a silicon oxide film cleaning process was performed. The cleaning process was performed using monoethanol amine and tetramethylammonium hydroxide (TMAH) at a brush rotation speed of 500 rpm and under the condition of spraying a cleaning solution for 60 seconds at a flow rate of 2000 cc/min. After the cleaning process was completed, the silicon oxide film wafer was moved in a sealed state to a wafer FOUP, and the total number of defects was measured using AIT-XP+ equipment.

(3) Measurement of Dishing of the Conductive Film

A dishing evaluation was performed using a 300 mm diameter wafer provided by BMI Tech. In the wafer, a silicon oxide film was used as an insulating film, a silicon nitride film was used as a barrier film, electroplated copper was used as a conductive film, and a circular opening of a through via had a diameter of 5 μm.

The polishing conditions were used as in (1) above, but the polishing time was changed to 50 seconds.

In the polished wafer for evaluation, each part of the wafer's center/middle/edge was sampled in a size of 4×4 cm, and a surface profile of a via opening was measured using Park Systems' AFM equipment, and an average height value of the through via was calculated and shown in the table below.

TABLE 2

| | Conductive film polishing rate (Å/min) | Barrier film polishing rate (Å/min) | Insulating film polishing rate (Å/min) | Polishing rate ratio 1 Conductive film based on insulating film | Polishing rate ratio 2 Conductive film based on barrier Film | Dishing of conductive film (nm) * | Defect evaluation of insulating film (ea) |
|---|---|---|---|---|---|---|---|
| Example 1 | 4302 | 2423 | 4135 | 1.04 | 1.78 | −3 | 58 |
| Example 2 | 3942 | 2142 | 3984 | 0.99 | 1.84 | −8 | 62 |
| Example 3 | 4127 | 2391 | 4014 | 1.03 | 1.73 | −9 | 46 |
| Comparative Example 1 | 4426 | 2341 | 4213 | 1.05 | 1.89 | −14 | 64 |

TABLE 2-continued

| | Conductive film polishing rate (Å/min) | Barrier film polishing rate (Å/min) | Insulating film polishing rate (Å/min) | Polishing rate ratio 1 Conductive film based on insulating film | Polishing rate ratio 2 Conductive film based on barrier Film | Dishing of conductive film (nm) * | Defect evaluation of insulating film (ea) |
|---|---|---|---|---|---|---|---|
| Comparative Example 2 | 3254 | 2215 | 3924 | 0.83 | 1.47 | +24 | 64 |

* Dishing of the conductive film means the results of an electroplated copper via with an opening diameter of 5 μm, "−" means that the surface of the conductive film is located under the baseline, which indicates dishing has occurred, and "+" means that the surface of the conductive film is located above the baseline, which indicates it actually protrudes.

Referring to Tables 1 and 2, the polishing process was performed at a conductive film polishing rate of about 3900 Å/m or more while controlling dishing to within about −10 nm by applying the compositions for semiconductor processing of Examples 1 to 3. In particular, since the polishing rates for the conductive film, the barrier film, and the insulating film are excellent, efficient surface polishing is possible, and it is evaluated to be particularly excellent for application to a substrate having a through via.

3. Evaluation of Physical Properties of Composition for Semiconductor Processing The composition was configured in the same manner as Example 1, but the physical properties were compared in the same manner as described above, depending on the presence or absence of a polymer, including a halogen group.

TABLE 3

| Parts by weight | Modified abrasive particle | First dishing control additive | Second dishing control additive | Organic acid | Phosphoric acid-based additive | Polymer including halogen group | pH adjusting agent |
|---|---|---|---|---|---|---|---|
| Example 1 | 15 | 0.02 | 0.01 | 0.025 | 0.02 | 0.001 | 0.075 |
| Comparative Example 3 | 15 | 0.02 | 0.01 | 0.025 | 0.02 | 0 | 0.075 |

| | Conductive film polishing rate (Å/min) | Barrier film polishing rate (Å/min) | Insulating film polishing rate (Å/min) | Polishing rate ratio 1 Conductive film based on insulating film | Polishing rate ratio 2 Conductive film based on barrier film | Dishing of conductive film (nm) * | Defect evaluation of insulating film (ea) |
|---|---|---|---|---|---|---|---|
| Example 1 | 4302 | 2423 | 4135 | 1.04 | 1.78 | −3 | 58 |
| Comparative Example 3 | 4214 | 2316 | 4183 | 1.01 | 1.82 | −6 | 437 |

Referring to Table 3, the polishing rate did not show a significant difference depending on whether or not the polymer, including a halogen group, was contained, and the degree of dishing was relatively slightly increased, but it was controllable within an appropriate level. However, it was confirmed that the presence or absence of the polymer including a halogen group made a large difference in the defect evaluation results of the insulating film, so that the effect of reducing defects in the insulating film was very excellent when the polymer including a halogen group was further included.

A polishing process can be performed more efficiently according to a composition for semiconductor processing and a semiconductor device manufacturing method of an embodiment. In particular, when applied to a polishing process of a substrate having a through via (for example: TSV, through silicon via), defects such as dishing, erosion, and protrusions can be minimized. In addition, in polishing a surface where a plurality of different films is exposed to the outside, a flat polishing surface can be realized without a thickness deviation between each film.

In the composition for semiconductor processing and the semiconductor device manufacturing method of the embodiment, when polishing a surface on which at least two materials among copper, silicon oxide, and silicon nitride are exposed, even with a relatively high polishing rate, it is possible to realize a flat polished surface without a thickness deviation between each material.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A composition for semiconductor processing comprising:
   abrasive particles; and
   a dishing control additive, comprising a first dishing control additive and a second dishing control additive,
   wherein the first dishing control additive comprises a compound having a betaine group and a salicylic group or a derivative thereof, and the second dishing control additive comprises an azole-based compound,
   the first dishing control additive comprises 0.07 parts by weight or more based on 100 parts by weight of the abrasive particles, and
   the second dishing control additive comprises 0.13 parts by weight or less based on 100 parts by weight of the abrasive particles.

2. The composition of claim 1,
   wherein the composition has a value according to Expression 1 below from 0.4 to 0.7, $$(C_{BS}-0.05)+C_{AZ}\times 5, \qquad \text{[Expression 1]}$$

where $C_{BS}$ is parts by weight of the first dishing control additive based on 100 parts by weight of the abrasive particles, and $C_{AZ}$ is parts by weight of the second dishing control additive based on 100 parts by weight of the abrasive particles.

3. The composition of claim 1,
   wherein the first dishing control additive and the second dishing control additive are comprised in a weight ratio of 1:0 to 0.95.

4. The composition of claim 1, wherein the composition comprises 3% by weight or more of the abrasive particles based on a total weight of the composition for semiconductor processing.

5. The composition of claim 1,
   further comprising an organic acid,
   wherein the organic acid comprises a citric acid.

6. A composition for semiconductor processing comprising:
   abrasive particles; and
   a dishing control additive, comprising a first dishing control additive including a compound from a betaine group and a salicylic group or a derivative thereof, and a second dishing control additive of an azole-based compound, wherein
   the composition has a value according to Expression 2 from 4 to 7, $$(C_P-5)\times\{(C_{BS}-0.05)+C_{AZ}\times 5\}, \qquad \text{[Expression 2]}$$

where $C_P$ is parts by weight of the abrasive particles based on 100 parts by weight of the composition for semiconductor processing, $C_{BS}$ is parts by weight of the first dishing control additive based on 100 parts by weight of the abrasive particles, and $C_{AZ}$ is parts by weight of the second dishing control additive based on 100 parts by weight of the abrasive particles.

7. The composition of claim 6, further comprising an organic acid and a polymer compound including a halogen group,
   wherein the polymer compound comprises 0.5 parts by weight or less based on 1 part by weight of the organic acid.

8. The composition of claim 6, wherein a ratio between a polishing rate for an insulating film and a polishing rate for a barrier film is 1:0.45 to 0.7.

9. The composition of claim 6, wherein a ratio between a polishing rate for an insulating film and a polishing rate for a conductive film is 1:0.85 to 1.2.

10. The composition of claim 6,
    wherein the composition polishes a substrate having a through via,
    the substrate includes an insulating film, a conductive film, and a barrier film on a surface thereof, and
    the conductive film has a polishing rate of 3,800 angstroms/min or more.

11. A method of manufacturing a semiconductor device, comprising:
    preparing a platen on which a polishing pad is mounted and a carrier accommodating a substrate having a through via; and
    polishing a surface of the substrate with a composition, using a polishing surface of the polishing pad, by rotating either one or both of the platen and the carrier,
    wherein the substrate comprises an insulating film, a conductive film, and a barrier film,
    the composition comprises abrasive particles and a dishing control additive, comprising a first dishing control additive and a second dishing control additive,
    the first dishing control additive comprises a compound having a betaine group and a salicylic group or a derivative thereof, and the second dishing control additive comprises an azole-based compound,
    the first dishing control additive comprises 0.07 parts by weight or more based on 100 parts by weight of the abrasive particles, and
    the second dishing control additive comprises 0.13 parts by weight or less based on 100 parts by weight of the abrasive particles.

12. The method of claim 11,
    wherein the composition has a value according to Expression 1 below from 0.4 to 0.7, $$(C_{BS}-0.05)+C_{AZ}\times 5, \qquad \text{[Expression 1]}$$

where $C_{BS}$ is parts by weight of the first dishing control additive based on 100 parts by weight of the abrasive particles, and $C_{AZ}$ is parts by weight of the second dishing control additive based on 100 parts by weight of the abrasive particles.

13. The method of claim 11,
    wherein the first dishing control additive and the second dishing control additive are comprised in a weight ratio of 1:0 to 0.95.

14. The method of claim 11,
    wherein the composition comprises 3% by weight or more of the abrasive particles based on a total weight of the composition for semiconductor processing.

15. The method of claim 11,
    wherein the composition comprises an organic acid, and the organic acid comprises a citric acid.

* * * * *